(12) United States Patent
Hesse et al.

(10) Patent No.: US 9,054,333 B2
(45) Date of Patent: Jun. 9, 2015

(54) ORGANIC LIGHT EMITTING DIODE AND CIRCUIT BOARD FOR CONTROL THEREOF

(75) Inventors: Jan Hesse, Dresden (DE); Christian Kirchhof, Dresden (DE); Udo Bechtloff, Mittweida (DE); Kai Schmieder, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 839 days.

(21) Appl. No.: 13/067,343

(22) Filed: May 25, 2011

(65) Prior Publication Data

US 2011/0298359 A1    Dec. 8, 2011

(30) Foreign Application Priority Data

Jun. 3, 2010  (DE) .................. 10 2010 023 550

(51) Int. Cl.
  *H01J 1/62*  (2006.01)
  *H01L 51/52*  (2006.01)
  *H05K 3/32*  (2006.01)
  *H05K 1/11*  (2006.01)

(52) U.S. Cl.
  CPC ........ *H01L 51/5203* (2013.01); *H01L 51/5243* (2013.01); *H01L 2251/5361* (2013.01); *H05K 1/112* (2013.01); *H05K 3/321* (2013.01); *H05K 2201/0108* (2013.01); *H05K 2201/09072* (2013.01); *H05K 2201/09363* (2013.01); *H05K 2201/10106* (2013.01)

(58) Field of Classification Search
  USPC .............. 313/609, 594, 623, 504; 257/88, 93
  See application file for complete search history.

(56) References Cited

U.S. PATENT DOCUMENTS

| | | | | |
|---|---|---|---|---|
| 5,703,394 A | * | 12/1997 | Wei et al. ...................... | 257/433 |
| 8,102,119 B2 | * | 1/2012 | Farquhar et al. ............... | 313/512 |
| 8,350,470 B2 | * | 1/2013 | Farquhar et al. ............... | 313/512 |
| 2006/0220036 A1 | * | 10/2006 | Lee et al. ......................... | 257/81 |
| 2008/0036373 A1 | * | 2/2008 | Itoh et al. ....................... | 313/504 |
| 2008/0231180 A1 | * | 9/2008 | Waffenschmidt et al. .... | 313/506 |
| 2011/0297996 A1 | * | 12/2011 | van den Brand et al. ....... | 257/99 |

FOREIGN PATENT DOCUMENTS

| | | |
|---|---|---|
| EP | 2144290 | 1/2010 |
| JP | 2009199777 | 9/2009 |
| WO | 2007013001 | 2/2007 |

* cited by examiner

*Primary Examiner* — Nimeshkumar Patel
*Assistant Examiner* — Jacob R Stern
(74) *Attorney, Agent, or Firm* — Jacobson Holman, PLLC.

(57) ABSTRACT

The invention relates to a lighting element, wherein at least one organic light-emitting diode is formed at an optically transparent substrate as a layer structure. In the lighting element in accordance with the invention, at least one organic light-emitting diode is formed at an optically transparent substrate as a layer structure. The at least one organic light-emitting diode and the substrate are connected to a circuit board and electric contact elements for the connection of the electrodes of the organic light-emitting diode(s) are present at the surface of the circuit board. The surface of the circuit board facing in the direction of the organic light-emitting diode(s) is provided over its full area with a metallic coating as a permeation barrier. The metallic coating is only breached by electric insulators formed about the contact elements.

12 Claims, 7 Drawing Sheets

ORGANIC LIGHT EMITTING DIODE AND CIRCUIT BOARD FOR CONTROL THEREOF

Figure 1:
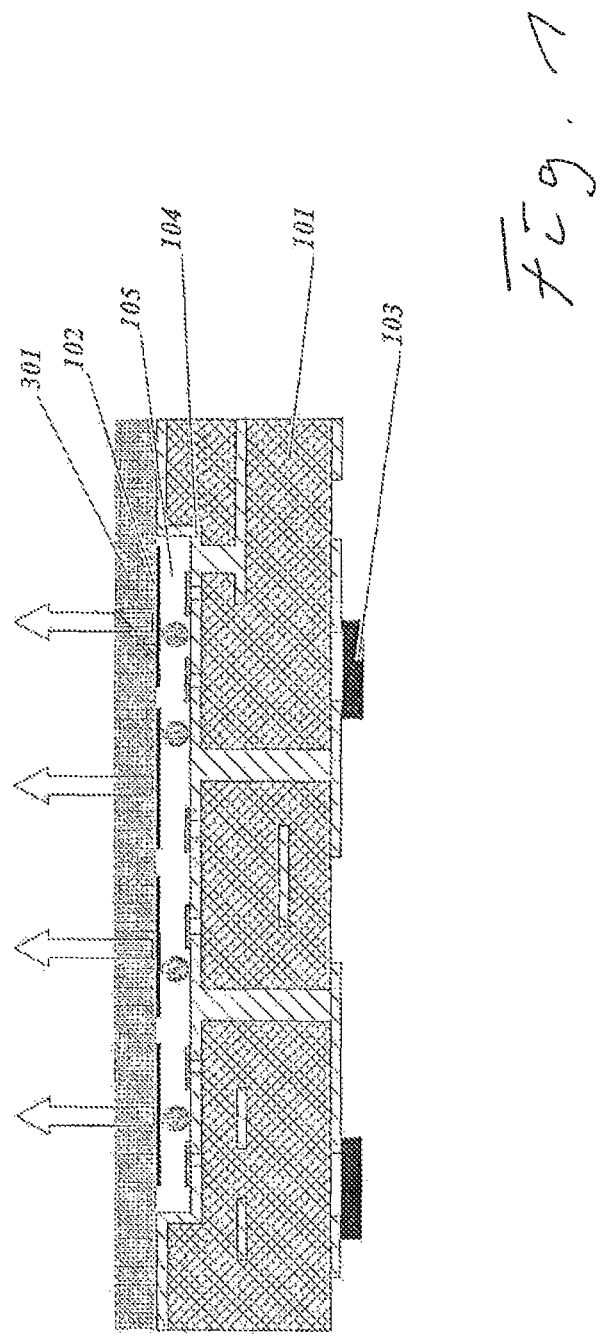

This application claims the priority of German number 10 2010 023 550.4 filed Jun. 3, 2010, hereby incorporated by reference.

The invention relates to a lighting element, wherein at least one organic light-emitting diode is formed at an optically transparent substrate as a layer structure. The at least one organic light-emitting diode and the substrate are connected to a circuit board. Electric contact elements for connecting the electrodes of the organic light-emitting diode(s) are present at the surface of the circuit board for the control of the organic light-emitting diode(s).

In the invention, organic light-emitting diodes, in the following also called OLEDs, can be used which are used as a multilayer structure having functional layers which are enclosed by an optically transparent electrode and a top electrode.

Glass substrates such as known from EP 1 087 649 A2 can be used as optically transparent substrates. In this respect, a via through a glass substrate should also be used as a carrier. It is necessary for this purpose to bore through the glass substrate and to fill the bore with an electrically conductive silver paste. When drilling into a glass substrate, microcracks necessarily form which can propagate and enlarge on temperature changes or on the effect of mechanical forces. They thus form points of entry for moisture and oxygen, which results in an impairment at organic light-emitting diodes.

A light-emitting diode having a multilayer circuit board which is enclosed by a sealant is described in U.S. Pat. No. 6,561,666 B2. The electric contacting of the electrodes of the light-emitting element takes place at the outer periphery, which results in an enlarged marginal region and thereby in an enlarged surface which cannot be used for the light emission. This in particular represents a disadvantage when a plurality of these elements should be used in a row arrangement or array arrangement since no light-emitting gaps are present between the elements.

In addition, points of entry for moisture and oxygen remain. As is known, however, moisture and oxygen are disturbance variables for OLEDs which have a disadvantageous influence on their functionality and service life. A sustained and secure sealing of the lighting elements is therefore a basic requirement in the use of organic light-emitting diodes.

There are problems in the known lighting elements with OLEDs due to the housing of the OLEDs between a glass substrate and a top glass. These are limitations in the secure unbundling/separation of the electric connections required for the contacting of the OLEDs or a technologically complex and/or expensive contacting directly on a glass substrate is required.

It is therefore the object of the invention to provide lighting elements having organic light-emitting diodes which can be manufactured simply and inexpensively, in so doing have an enlarged surface which can be utilized for the emission of light and achieve an improved sealing which avoids penetration of moisture and oxygen from the environment.

In accordance with the invention, this object is achieved by a lighting element having the features of claim 1. Advantageous embodiments and further developments of the invention can be realized using features designated in the subordinate claims.

A lighting element in accordance with the invention has at least one organic light-emitting diode which is formed as a layer structure in an optically transparent substrate. The at least one organic light-emitting diode and the substrate are connected to a circuit board. Electric contact elements for the connection of the electrodes of the organic light-emitting diode(s) are present at the surface of the circuit board.

In this respect, the surface of the circuit board facing in the direction of the organic light-emitting diode(s) is provided over its full area with a metallic coating as a permeation barrier. The metallic coating is only breached by electric insulators formed about the contact elements. It is obvious that these surface regions, which are very small in relation to the overall surface and which are not covered by the metallic coating, can be sealed simply and reliably to avoid a penetration of a fluid from the environment.

The metallic coating can be applied directly to the surface of the circuit board. This can take place, for example, by pressing on a metallic foil or in a wet chemical manner (galvanic or chemical deposition) and therefore inexpensively using technology anyway usually utilized in circuit board manufacture.

The metallic coating also prevents a permeation of gaseous components which are degassed from polymers, e.g. from the circuit board.

The surface of the circuit board facing in the direction of the organic light-emitting diode(s) and the metallic coating advantageously form a three-dimensionally structured surface. At least the contact elements for the connection of the electrodes of the OLED are designed in socket shape at the structured surface. In this respect, they form elevated portions in the interior of a lighting element. It is also favorable to design the radially outer marginal region as raised which forms the join zone with the corresponding margin of the optically transparent substrate. The connection having material continuity can be established, preferably by adhesive bonding, in this join zone. In this respect, a so-called encapsulating adhesive can be used. The connection having material continuity can, however, also be established using suitable glass solder or in combination of glass solder and encapsulating adhesive.

The three-dimensional structuring can be formed with contact elements designed as elevated and/or with a raised marginal region.

At least one hollow space can be formed between the elevated portions in the interior of the lighting element and said hollow space can be utilized for the reception of a hygroscopic substance (getter deposit). Water which may have nevertheless penetrated can thereby be absorbed and a contact with the sensitive substances of the organic light-emitting diode can be avoided.

Damage to the multilayer structure of OLEDs in a corresponding arrangement can moreover be avoided using the structured surface and the joining to the radially outer marginal having material continuity. In this respect, a radially outer marginal should also include outer marginal geometries which are not designed rotationally symmetrically or do not have any curved outer margins. Lighting elements can accordingly also have a multi-angular marginal geometry.

Only a narrow marginal region is required for the joining so that the surface at the outer margin of a lighting element in accordance with the invention which cannot be utilized for the emission of light can be kept small. Subsequently to the joining, a possibly still projecting marginal region can be simply cut off, which can be achieved simply by sawing or laser cutting.

The contact elements can each be electrically conductively connected by means of a via (i.e., a "feed through") led to the rear side of the circuit board. The electric insulators can be designed in the form of a sleeve surrounding the vias.

The outwardly facing end faces of the electric insulators can be additionally sealed with an encapsulating adhesive.

In the via, sufficiently large contact surfaces can be formed at both sides of the circuit board which can be utilized for an electric contacting.

A multilayer circuit board can be likewise be used in which electrically conductive connections are present in a plurality of levels. These electrically conductive connections can likewise be connected to one another using correspondingly shorter trenched contacts or blind hole contacts or can be led up to the rear side or to the side of the circuit board disposed opposite it.

The circuit board of a lighting element in accordance with the invention can be formed using a material containing an epoxy resin provided with and without fiber reinforcement.

An electric insulator at a via present at the circuit board can be formed with a dielectric outer sleeve which surrounds a dielectric cylinder and a hollow cylindrical element or filler arranged between the sleeve and the cylinder. A hollow cylindrical element or a filler can form the electrically conductive connection of the via.

The metallic coating can be formed using Au, Ag, Cu, Al, Ni, Sn or an alloy thereof. It can have a layer thickness in the region of 5 µm to 250 µm. In this respect, a plurality of metal layers above another can form the metallic coating. A layer of copper whose layer thickness is larger than further metal layers formed thereon can thus be formed directly on the surface of the circuit board and at least one protective layer of gold, silver or tin can have been formed on said further metal layers. In particular with an outer protective layer of gold, a barrier layer should be formed thereunder which forms a diffusion barrier for the gold. A barrier layer can be made from nickel. A reliable permeation barrier effect can be achieved using such a relatively small layer thickness of the metallic coating.

There is furthermore the possibility of providing the surface of the metallic coating with a dielectric protective layer. A hollow space present between the optically transparent substrate having at least one OLED and the metallic coating can be filled completely or partly with a dielectric substance, for example with encapsulating adhesive. In this respect, however, the contact elements and/or a hygroscopic substance arranged in a hollow space should remain uncoated.

The end surfaces of the vias, which are contacted by a top electrode of an organic light-emitting diode can be covered directly by the metallic coating. The metallic coating can thereby additionally be utilized for the electrically conductive connection.

An electrically conductive substance can be applied in spot-form to vias and/or to a contact surface. This can be electrically conductive adhesive or a solder.

A gap having a clearance between 5 µm and 100 µm can be formed between the organic light-emitting diode(s) and/or the surfaces of the contact element facing in the direction of the optically transparent substrate and/or the metallic coating by a suitable dimensioning of a marginal region formed as elevated and/or by the thickness of a encapsulating adhesive or glass solder applied between the marginal region and the optically transparent element for the connection having material continuity. A penetration of moisture and oxygen can thereby further be prevented or at least reduced.

The organic light-emitting diode(s) can be provided with at least one thin-film encapsulating layer in the interior of the lighting element. This thin-film encapsulating layer or these thin-film encapsulating layers can additionally protect the sensitive components of the organic light-emitting diodes. They can be made, for example from perylene and/or silicon nitride.

Contact regions for the contacting of the transparent electrode and/or of the top electrode of organic light-emitting diodes can preferably be arranged within the active surface region of the respective organic light-emitting diode. This can apply to the contact regions of the transparent electrode and also to those of the top electrode. However, all contact regions can also be arranged outside the active surface region of the respective organic light-emitting diode from which light is emitted.

If contact regions are arranged within the active surface region, they can be surrounded by the top electrode and can thereby also be electrically insulated therefrom if it is a question of a contact region for an optically transparent electrode. With such an arrangement of contact regions within the active surface region, the overall area useful for the emission of light can be enlarged. In the region of contact regions arranged there, the one or more thin-film encapsulating layers can be omitted so that a free access to the respective contact region is possible there. This can also be achieved by a suitable layer formations, for example using masks.

The invention will be explained in more detail by way of example in the following.

Figure 2:
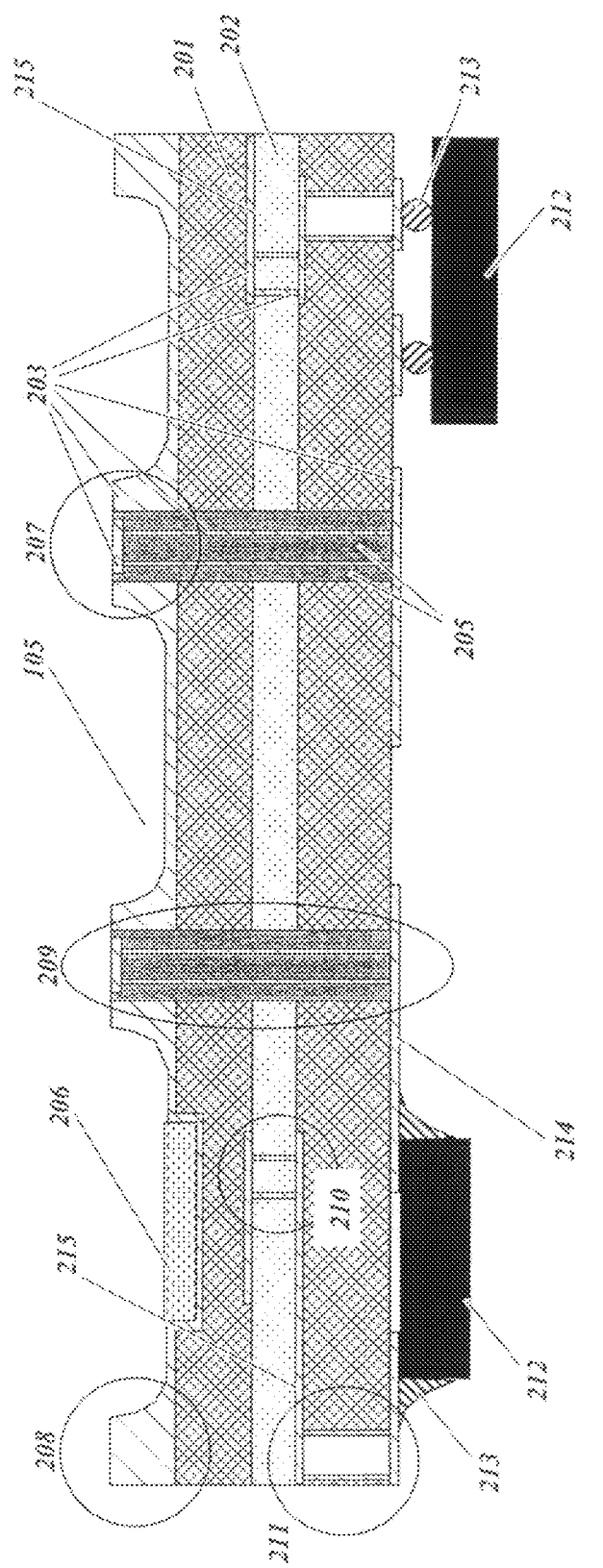
Figure 3:
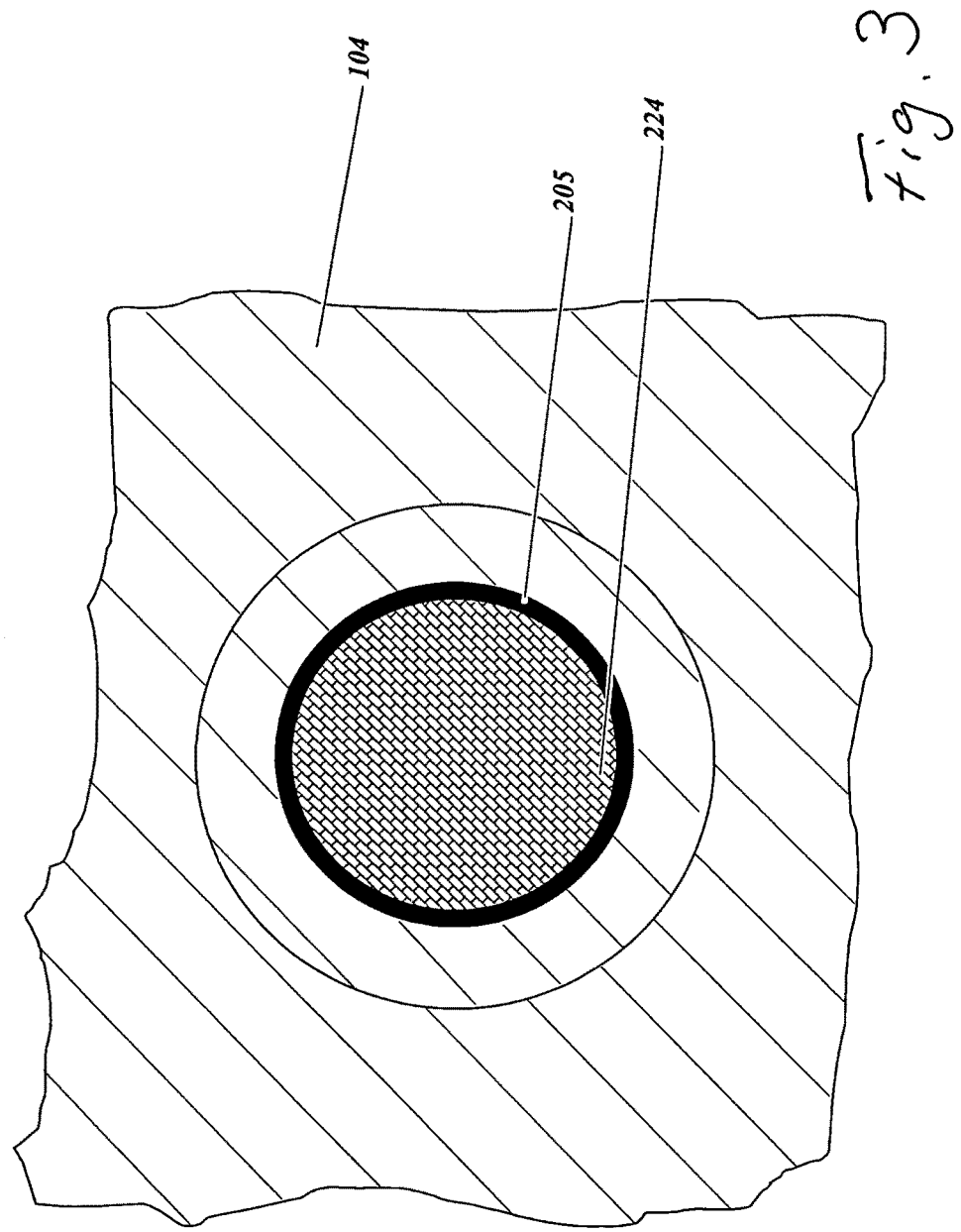
Figure 4:
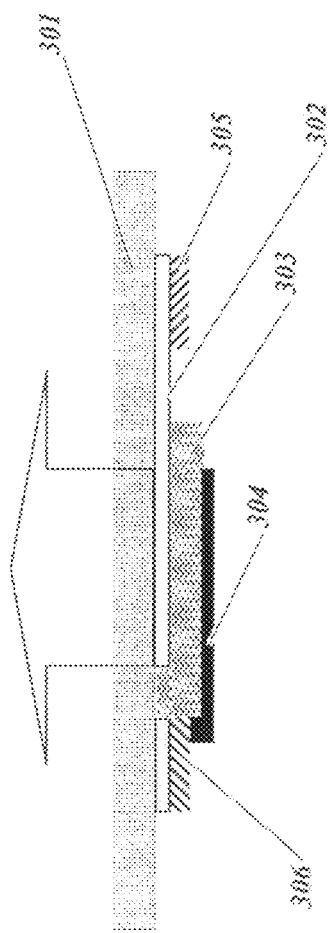
Figure 5:
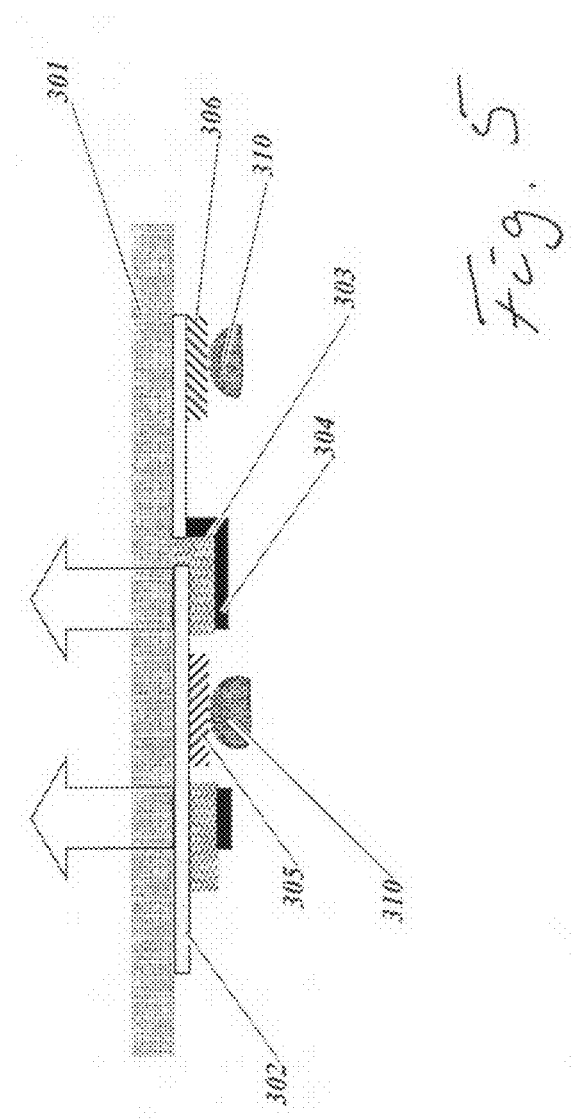
Figure 6:
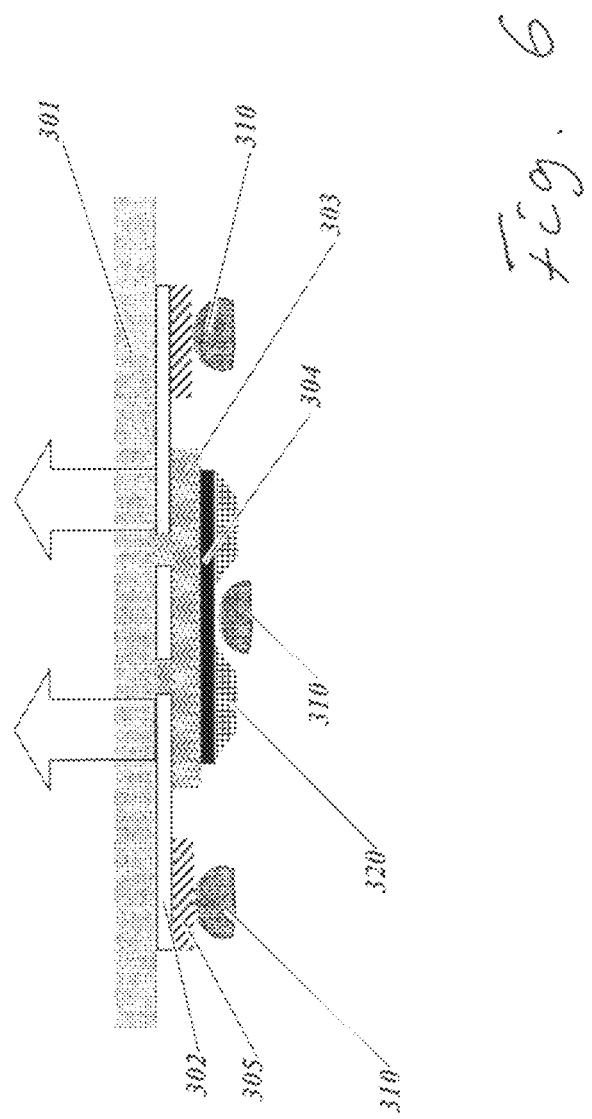
Figure 7:
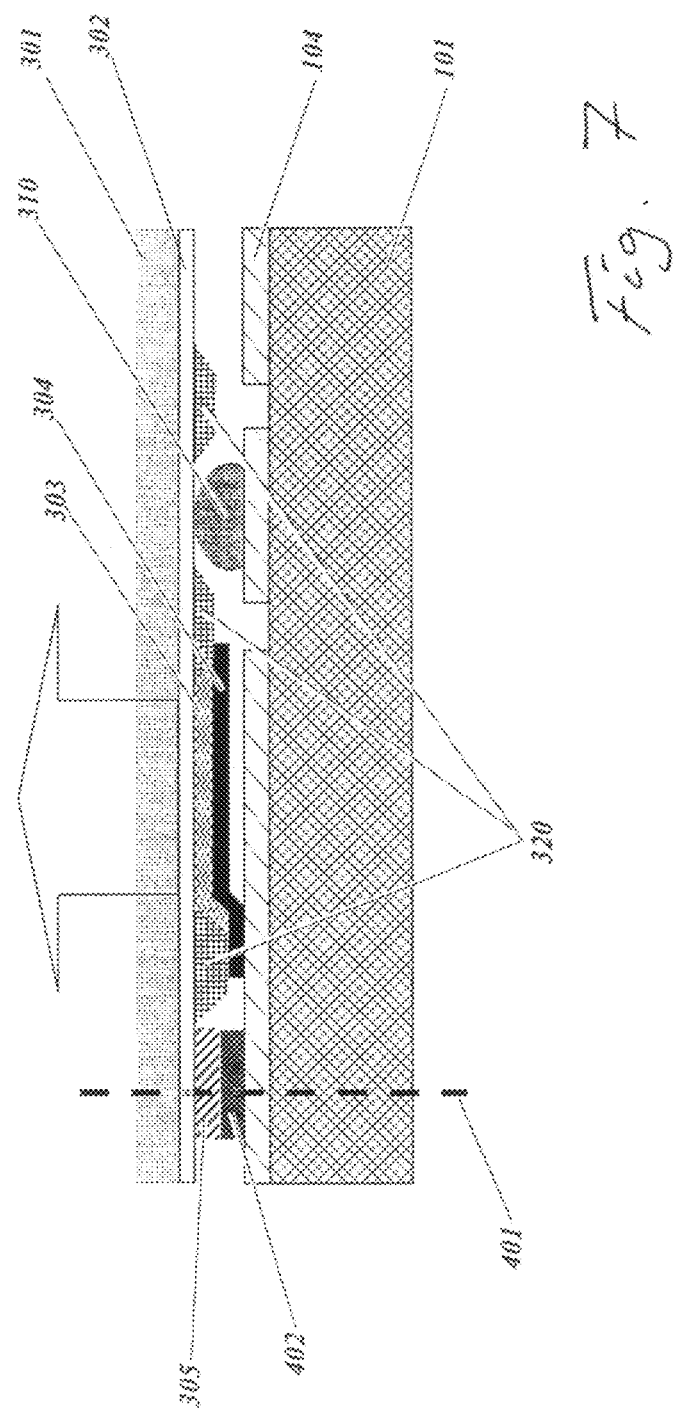

There are shown:

FIG. 1 in a schematic sectional representation, an example of a lighting element in accordance with the invention with four organic light-emitting diodes in a row arrangement;

FIG. 2 a sectional representation of a circuit board which can be used in a lighting element in accordance with the invention;

FIG. 3 an enlarged part view from above of a surface of a circuit board provided with a metallic coating and having a contact element;

FIG. 4 a multilayer structure of an organic light-emitting diode formed at an optically transparent substrate;

FIG. 5 a possibility for an electrically conductive connection of electrodes of organic light-emitting diodes;

FIG. 6 a further possibility for an electrically conductive connection of electrodes of organic light-emitting diodes; and FIG. 7 a partial sectional representation through an example of a lighting element in accordance with the invention.

FIG. 1 shows a sectional representation of a lighting element with four organic light-emitting diodes 102 which are formed as a multilayer structure in a row on an optically transparent substrate 301. The substrate 301 formed in this manner is connected to a multilayer circuit board 101 by adhesive bonding having material continuity at the radially outer margins. The surface of the circuit board 101 facing in the direction of the optically transparent substrate 301 has been provided with a metallic coating 104 having three layers formed on top of one another. A layer of copper is formed on the surface of the circuit board 101, a nickel layer is formed on the copper layer and a protective layer of gold thereon.

For an electrically conductive connection to electrodes of the organic light-emitting diodes 102, vias 209 are led through the circuit board 101 up to the rear side of the circuit board 101 and additional trenched contacts 210 up to a conductor path in an inner plane of the circuit board 101.

Electronic elements 103 for the control of the organic light-emitting diodes 102 are attached to the rear side of the circuit board 101 and are electrically conductively connected via the vias (i.e., "feed through") 209 to the electrodes of the organic light-emitting diodes 102.

A hollow space 105 is present between the optically transparent substrate 301 and the surface of the circuit board 101 in the region in which the organic light-emitting diodes 102 are arranged.

Optionally, and not shown in FIG. 1, the surface of the metallic coating 104 can be provided with a dielectric protective layer which is only interrupted in the region of contact elements 27 likewise not shown here. In this respect, such a protective layer can be formed with an encapsulating adhesive and only the contact surface 224 can be left free (see FIG. 3).

FIG. 2 shows a sectional representation through a circuit board 101 which can be used with a lighting element in accordance with the invention. Electronic components 212 for the control of the electrodes of organic light-emitting diodes 102 (not shown here) are attached to the rear side of the circuit board 101 and are fastened thereto electrically conductively by soldering using a solder contact 213 and are then guided using electric conductor paths 214 via the vias 209. The contact elements 207 are connected at the oppositely disposed side of the circuit board 101 at the vias 209 and can in turn be connected to the electrodes, not shown, of the organic light-emitting diodes, as will be described in the following.

At least one laminate 202 and fiber-reinforced adhesive films 201 containing epoxy are present in the circuit board 101. Electric conductor paths 214, 215 and the electrically conductive elements 203 at the vias 209, at the trenched contacts 210 and at the blind-hold contacts 211 as well as at the contact elements 207 can be formed from copper which is provided with a metallic or organic protective coating at the surface to prevent oxidation.

Sleeve-shaped electric insulators 205 made from a dielectric substance are present at the vias 209. The substance should have a thermal coefficient of expansion which is matched to the thermal coefficient of expansion of the circuit board 101.

The upper side of the circuit board 101 is provided with the metallic coating 104. In this respect, a layer of copper is first applied to the surface and a barrier layer of nickel having a layer thickness in the range of 4 μm to 8 μm is formed on this copper layer and on said barrier layer a protective layer of gold having a layer thickness of approx. 50 nm. In this respect, the radially outer marginal regions 208 as well as the projecting region of the vias 209 having the contact elements 207 are formed as raised so that, as can be recognized in FIG. 1, a hollow space 105 is formed between the optically transparent substrate 301 and the remaining surface, which is lower, of the circuit board 101.

In a region of the hollow space 105, a hygroscopic substance 206 is present with which penetrated moisture can be absorbed and can be kept away from organic light-emitting diodes 102. The hollow space 105 can also be filled partly or completely with a suitable sealant.

In a form not shown, instead of the three-dimensional structured surface of the circuit board 101, a corresponding surface structure in complementary shape can also be formed at the surface of the optically transparent substrate 301 facing in the direction of the circuit board 101. For this purpose, additional structural elements can be attached to this surface. They can be called passivation zones 320 and are formed, for example, as shown in FIG. 7.

FIG. 3 is a plan view of a partial region of the surface of a circuit board 101 having a contact element 207 of which only the contact surface 224 is visible and which projects with a part of the via 209 in raised form beyond the surface of the circuit board 101 at which the metallic coating 104 is formed.

The electric insulator 205 is here a dielectric sleeve. An electrically conductive substance or a metal can be present in the interior of the electric insulator 205.

Alternatively to this, there is the possibility with vias 209 of using a cylindrical insulator in the interior which is surrounded by a hollow cylindrical element or a filler of an electrically insulating substance or substance mixture which forms the electrically conductive connection of the via 209, and then the element or the filler is surrounded by an electrically insulating sleeve. Accordingly, the insulator can also be formed by an inner cylinder and an outer sleeve.

In FIG. 4, an optically transparent substrate 301 having an organic light-emitting diode 102 is shown. An optically transparent electrode 302, for example from ITO, is formed directly on a surface of the substrate 301. It is followed by a multilayer structure of functional layers 303 on which in turn the so-called top electrode 304 made from copper or from another suitable metal is formed. Contact regions 305 and 306 made from an electrically conductive substance or metal are present at the electrodes 302 and 304 and an electrically conductive connection from an optically transparent electrode 302 of an organic light-emitting diode 102 to a top electrode 304 arranged next to it can be established via said contact regions to the contact region 306 or to a contact element 207 (not shown here).

The last named aspect can be seen better from FIGS. 5 and 6. An electrically conductive adhesive 310 is applied there. The contact region 306 in FIGS. 5 and 6 is in this respect arranged by a corresponding configuration of the optically transparent electrodes 302 outside the active surface region from which light is emitted and in which the functional layers 303 are arranged. The optically transparent electrode 302 can thus be contacted directly. The top electrode 304 can in this respect likewise be directly electrically contacted, as is shown in FIG. 6. An electrically non-conductive passivation 320 is also additionally formed there which is interrupted and in which interruption an electrically conducive connection can be established using the conductive adhesive 310. Damage and electrical short-circuits in optically active regions of an organic light-emitting diode 102 can be avoided using the passivations 320.

In a form not shown, an additional protective layer can be applied to the top electrode 304 as a thin film for increasing the barrier effect toward any water or oxygen which may have penetrated.

FIG. 7 additionally shows how the connection which has material continuity and is tight for fluids, in particular for gases, can be established to a lighting element in accordance with the invention using a conventional encapsulating adhesive 402 in the marginal region 208. It should be indicated by the dashed line 401 that a separation of the outwardly facing part can take place there after the hardening of the encapsulating adhesive 402 so that the outer marginal region of a lighting element, which cannot be used, can again be reduced. The remaining elements of the example shown in FIG. 7 correspond according to their reference numerals to the examples described above. Only no three-dimensional structuring of the surface of the circuit board 101 has been selected.

The invention claimed is:

1. A lighting element, wherein at least one organic light-emitting diode is formed at an optically transparent substrate as a layer structure, said organic light emitting diode including electrodes having contact regions associated therewith, said at least one organic light-emitting diode and said substrate are connected to a circuit board, having electric contact elements for connecting with said electrodes of the organic light-emitting diode(s), an electric insulator extends through said circuit board and comprises a dielectric outer sleeve which surrounds a dielectric cylinder, a hollow cylindrical filler is arranged between the sleeve and the cylinder, said hollow cylindrical filler being electrically conductive and defines the electric contact elements;

wherein said contact regions for the organic light-emitting diode electrodes are arranged within an active surface region of the respective organic light-emitting diode;

wherein said surface of the circuit board faces in the direction of the organic light emitting diode(s) and is provided over its full surface with a metallic coating as a permeation barrier against permeation of moisture and gases, said metallic coating interrupted only by said electric insulator(s) formed about said contact elements;

wherein said metallic coating forms a three-dimensionally structured surface at which at least said contact elements are designed in socket shape and an outer marginal region of the lighting element is raised;

wherein said circuit board and the optically transparent substrate are connected fluid tight to one another in said outer marginal region.

2. A lighting element in accordance with claim 1, characterized in that the contact elements are electrically conductively connected to a rear side of the circuit board.

3. A lighting element in accordance with claim 2, characterized in that an electrically conductive substance is applied in spot form to said contact element.

4. A lighting element in accordance with claim 1, characterized in that said metallic coating is formed with Au, Ag, Cu, Al, Ni, Sn or an alloy thereof and has a layer thickness in the range of 5 μm to 250 μm.

5. A lighting element in accordance with claim 1, characterized in that the metallic coating is formed with a layer of copper formed on the surface of the circuit board and at least one protective layer formed on the layer of copper.

6. A lighting element in accordance with claim 1, characterized in that a hollow space is formed within said structured surface.

7. A lighting element in accordance with claim 1, characterized in that a hollow space is formed between the surface of the metallic coating and the optically transparent substrate and is at least partly filled with a dielectric substance and/or a hygroscopic substance.

8. A lighting element in accordance with claim 1, characterized in that the circuit board is formed with a material containing epoxy resin.

9. A lighting element in accordance with claim 1, characterized in that a contact surface for contacting an electrode of said organic light-emitting diode is present at an end face of said electric insulator and electric contact elements therewithin and faces in the direction of the optically transparent substrate.

10. A lighting element in accordance with claim 9, characterized in that the end face is directly covered by a metallic coating and are contacted by a top electrode of said organic light-emitting diode.

11. A lighting element in accordance with claim 1, characterized in that a gap having a clearance between 5 μm and 100 μm can be present between said organic light-emitting diode (s) and a surface of said contact element and faces in the direction of the optically transparent substrate.

12. A lighting element in accordance with claim 1, characterized in that the organic light-emitting diode(s) (102) are provided with a least one thin-film encapsulating layer in the interior of the lighting element.

* * * * *